(12) United States Patent
Hecht et al.

(10) Patent No.: US 7,157,371 B2
(45) Date of Patent: Jan. 2, 2007

(54) BARRIER LAYER AND A METHOD FOR SUPPRESSING DIFFUSION PROCESSES DURING THE PRODUCTION OF SEMICONDUCTOR DEVICES

(75) Inventors: Thomas Hecht, Dresden (DE); Uwe Schroeder, Dresden (DE); Harald Seidl, Feldkirchen (DE); Martin Gutsche, Dorfen (DE); Stefan Jakschik, Dresden (DE); Stephan Kudelka, Ottendorf-Okrilla (DE); Albert Birner, Dresden (DE)

(73) Assignee: Infineon Technologies AG, Munich (DE)

( * ) Notice: Subject to any disclaimer, the term of this patent is extended or adjusted under 35 U.S.C. 154(b) by 94 days.

(21) Appl. No.: 10/653,599

(22) Filed: Sep. 2, 2003

(65) Prior Publication Data

US 2004/0082166 A1  Apr. 29, 2004

(30) Foreign Application Priority Data

Aug. 30, 2002  (DE) .............................. 102 40 106.3

(51) Int. Cl.
*H01L 21/44* (2006.01)
(52) U.S. Cl. ................... 438/653; 257/E21.076
(58) Field of Classification Search ................ 438/637, 438/639, 643, 653, 758, 768, 791, 792, 584, 438/597, 618–627, 642, 652, 778, 785; 257/E21.16, 257/E21.076
See application file for complete search history.

(56) References Cited

U.S. PATENT DOCUMENTS 5,736,192 A * 4/1998 Okamoto .................. 216/17
5,981,350 A 11/1999 Geusic et al.
6,144,050 A * 11/2000 Stumborg et al. ........... 257/213
6,153,523 A * 11/2000 Van Ngo et al. ............ 438/687
6,391,803 B1 5/2002 Kim et al.
6,518,671 B1 2/2003 Yang et al.
6,583,464 B1 6/2003 Bertagnolli et al.
6,593,633 B1 7/2003 Jan et al.
2001/0044180 A1 11/2001 Schrems et al.
2002/0014647 A1 2/2002 Seidl et al.

FOREIGN PATENT DOCUMENTS

DE   100 19 090 A1   10/2001
DE   100 34 003 A1    1/2002
DE   101 01 526 A1    8/2002
EP       738002 A2 * 10/1996

OTHER PUBLICATIONS

K.H. Küsters et al.: "A Stacked Capacitor Cell with a Fully Self-Aligned Contact Process for High-Density Dynamic Random Access Memories", *J. Electrochem. Soc.*, vol. 139, No. 8, Aug. 1992, pp. 2318-2322.

* cited by examiner

*Primary Examiner*—Brook Kebede
(74) *Attorney, Agent, or Firm*—Laurence A. Greenberg; Werner H. Stemer; Ralph E. Locher

(57) ABSTRACT

A dielectric barrier layer composed of a metal oxide is applied in thin layers with a thickness of less than 20 nanometers in the course of processing semiconductor devices by sequential gas phase deposition or molecular beam epitaxy in molecular individual layers on differently structured base substrates. The method allows, inter alias, effective conductive diffusion barriers to be formed from a dielectric material, an optimization of the layer thickness of the barrier layer, an increase in the temperature budget for subsequent process steps, and a reduction in the effort for removing the temporary barrier layers.

15 Claims, 6 Drawing Sheets

BARRIER LAYER AND A METHOD FOR SUPPRESSING DIFFUSION PROCESSES DURING THE PRODUCTION OF SEMICONDUCTOR DEVICES

BACKGROUND OF THE INVENTION

Field of the Invention

The invention relates to a method for avoiding impurities in layers and structures in a semiconductor wafer caused by extraneous substances in the course of manufacturing semiconductor devices. In the manufacturing process, a base substrate is provided, which at least in places is formed of a primary material. A barrier layer composed of a barrier material which is essentially impermeable to one or more extraneous substances is provided at least on those sections of one substrate surface of the base substrate which are formed by the primary material, and the substrate which has been provided with the barrier layer is subjected to further processing, with the barrier layer preventing the extraneous substance or substances from emerging from/penetrating into the primary material.

As the sizes of structures in semiconductor devices become ever smaller and as the spectrum of the materials that are used widens, barrier layers are becoming increasingly important in semiconductor process technology, in order to largely prevent extraneous substances from migrating between two layers of structures or between one layer or structure and a surrounding atmosphere.

The extraneous substance that is entering may in this case be chemically active and may oxidize or reduce a material of the relevant layer or structure, such as $O_2$, $H_2$, NO, $N_2O$ and $NH_3$. Sources of oxidizing or reducing substances are both solids and a process atmosphere or a surrounding atmosphere.

The inward diffusion of chemically largely inactive extraneous substances in the form of individual atoms contaminates the relevant layer or structure. Impurities lead to faults in the crystal gratings, and change the electrical, chemical and physical characteristics of the relevant structure in a generally disadvantageous manner.

The source of extraneous atoms is the structures and layers that are adjacent to the relevant layers or structures, or an environment that is contaminated by the extraneous atoms. Barrier layers are therefore also provided in order to prevent substances from diffusing out into a surrounding or process atmosphere.

When using copper as the material for low-resistance connecting lines, it is normal to use diffusion barriers, in the form of barrier layers, composed of transitional metal nitrides such as titanium nitride, which prevent copper from diffusing into semiconductor structures and dielectric insulator structures.

Known concepts for ferroelectric memory cells for FeRAMS (ferroelectric random access memories) provide iridium or ruthenium layers as oxygen barrier layers at a junction between a connecting structure for a selection transistor for the memory cell and a platinum electrode for a ferroelectric memory device. The connecting structure is composed of polycrystalline silicon or of metal whose oxidation during any recrystallization process of the ferroelectric material is prevented by the oxygen barrier layer. Hydrogen barrier layers protect the ferroelectric material against reduction during hydrogen heat treatment, which is normally carried out at a number of points in the process flow, in particular towards the end of the processing of a semiconductor device.

Silicon nitride layers prevent oxidation or reduction of layers and structures to be protected when tampering or annealing steps have to be carried out in an oxidizing or reducing environment, for example for recrystallization of process layers.

The previously known barrier layers, for example in the form of silicon nitride layers, have the disadvantage that their thermal budget is restricted. Barrier layers deposited using chemical low-pressure gas phase deposition (low pressure chemical vapor deposition, LPCVD) have the particular disadvantage that the layer thickness resulting from the nature of the deposition process is not uniform. In order to ensure a minimum functionality level, which is governed by the weakest point, the barrier layer is provided with a greater average layer thickness than would be necessary for uniform coverage. As the layer thickness increases, the removal of a temporary barrier layer becomes more complex and any disturbance effect resulting from remnant barrier layer becomes greater. Barrier layers provided in a conventional manner, in particular on structured, three-dimensional surfaces, are difficult to process.

SUMMARY OF THE INVENTION

It is accordingly an object of the invention to provide a barrier layer and a method for suppressing diffusion processes during the production of semiconductor devices that overcome the above-mentioned disadvantages of the prior art devices and methods of this general type, that makes it possible to prevent extraneous substances from emerging from and/or penetrating into structures and layers, independently of the configuration of the structure and structuring of the layer, and in which disadvantageous side effects of the barrier layers that are provided in a conventional manner are reduced.

With the foregoing and other objects in view there is provided, in accordance with the invention, a method for avoiding impurities in layers and structures in a semiconductor wafer caused by extraneous substances in a course of manufacturing semiconductor devices. The method includes providing a base substrate formed at least in places from a primary material and using a sequential gas phase deposition process or a molecular beam epitaxy process for forming a dielectric layer on at least sections of one substrate surface of the base substrate formed of the primary material. The dielectric layer is formed silicon nitride, a metal oxide, or an oxide of rare earths. The dielectric layer functions as a barrier layer composed of a barrier material and is substantially impermeable to the extraneous substances. The base substrate with the barrier layer is subjected to further processing, with the barrier layer preventing an extraneous substance from emerging from/penetrating into the primary material.

According to the method for avoiding impurities in layers and structures in a semiconductor wafer caused by extraneous substances during the course of manufacturing semiconductor devices, a base substrate is provided which is formed at least in places from a primary material. The barrier layer composed of a barrier material that is essentially impermeable to one or more extraneous substances is provided on the sections of one substrate surface of the base substrate that are formed by the primary material. The substrate that has been provided with the barrier layer is subjected to further processing. During the processing, the barrier layer prevents the extraneous substance or substances from emerging from the primary material, and/or prevents an extraneous substance from penetrating into the primary material.

According to the invention, for this purpose, the barrier layer is deposited by sequential gas phase deposition (i.e. atomic layer deposition (ALD)) or molecular beam epitaxy as a dielectric layer on the base substrate, and, in the process, is provided from silicon nitride, a metal oxide, or else an oxide of rare earths.

If the barrier layer is provided as a conformal layer system composed of two or more molecular individual layers of a dielectric material, as is produced by sequential gas phase deposition, then this also results in barrier characteristics which are considerably better than those of conventional barrier layers, with a comparable maximum layer thickness. Particularly if the barrier layer is applied to a three-dimensional substrate surface that is structured in the form of a relief, the thickness of the barrier layer can be considerably reduced in comparison to conventional methods, since good edge coverage is achieved even with thin layers whose thickness is only a few nanometers. Since the barrier characteristics are directly related to the layer thickness and since, furthermore, the layer thickness, when using the method according to the invention, can be set accurately to a single molecular individual layer, the layer thickness of the barrier layer can advantageously be matched precisely to the requirements, or can be minimized. This makes it considerably easier to remove temporary barrier layers. Functional disturbance effects caused by remnant barrier layers, for example with an increased electrical resistance transversely with respect to the barrier layer, are reduced. The thinness of the layer also makes it possible to leave barrier layers which are required only temporarily and which would have to be removed again if they were provided in a conventional manner, or to remove them without any additional etching process.

Metal oxides such as $HfO_2$, $ZrO_2$, $Ta_2O_5$, $Nb_2O_5$, $Al_2O_3$ including oxides of rare earths such as $Pr_2O_5$ and $La_2O_3$ have a high temperature budget, owing to their high enthalpy of formation. Barrier layers produced in the course of the method according to the invention thus advantageously allow the subsequent processing to be carried out in a more variable manner, since they then have a higher temperature budget.

Dielectric barrier layers in some circumstances have better adhesion characteristics to the base substrate located underneath and to a process layer that is applied to them.

The dielectric barrier layers can also contribute to reducing mechanical stresses between the layers or structures separated by them, such as those that occur during tampering or heat-treatment steps involving high process temperatures.

The method according to the invention makes it possible to form conformal barrier layers or boundary area layers with a layer thickness for which even boundary area layers and barrier layers composed of dielectric materials should be regarded as being electrically conductive owing to the tunnel effect.

The barrier layer is particularly advantageously provided with a layer thickness with which charge carrier transport based on the quantum-mechanical tunnel effect through the barrier layer can occur to more than an inconsiderable extent. Depending on the application and on the material that is used, current densities of more than about $10^{-5}$ A/cm$^2$ to $10^{-4}$ A/cm$^2$ for applications with an insulating character and of more than $10^{-2}$ A/cm$^2$ for applications with a conductive character may be assumed for charge carrier transport to more than an inconsiderable extent.

In certain cases, the barrier layers are subjected to a tempering or annealing step after the deposition process, in the course of which aluminum oxide, which is initially deposited in an amorphous manner by a sequential gas phase deposition process, is compressed, for example, to form crystallites with a different crystal structure. With layer thicknesses of less than about 20 nanometers and, for example, with aluminum oxide as the barrier material, tunneling of charge carriers assisted by faults (trapped assisted tunneling) can occur to a significant extent along the grain boundaries formed by the crystallites. If a barrier layer with a layer thickness such as this is provided, then any disturbing influence of a remnant barrier layer, for example with regard to the electrical resistance between a first conductive structure in the base substrate and a second conductive structure in a process layer that is provided on the barrier layer, remains low.

The barrier layer is preferably deposited with a layer thickness of less than 20 nanometers. Temporary barrier layers, for example aluminum oxide layers with a thickness of about 5 nanometers, and whose layer thicknesses are thus very small, can effectively be pulverized and removed easily by mechanical processes, for example by particle bombardment.

The method is particularly advantageous if the base substrate that is provided has a three-dimensional relief, which is formed from trenches and webs, on the substrate surface. In this case, the good edge coverage of the deposition method allows the layer thickness of the barrier layer to be made much thinner than with conventional methods.

In a first preferred embodiment of the method according to the invention, the barrier layer that is provided according to the invention prevents oxidizing or reducing extraneous substances from penetrating into the primary material that is located under the barrier layer.

If a perovskite such as strontium-bismuth tantalate, SBT or lead-zirconium titanate PZT, is provided, by way of example, as the primary material in the course of manufacturing a ferroelectric semiconductor device, then the barrier layer advantageously prevents the perovskite from being reduced by hydrogen diffusing into it during hydrogen tampering of the base substrate.

The barrier layer prevents the formation of nitrides of the primary material, for example silicon, a metal or a transitional metal, in an environment containing ammonia during a heat-treatment step.

The barrier layer prevents the primary material from being doped with arsenic during a heat-treatment step in an environment containing arsenic ($AsH_3$).

After the heat-treatment or annealing step, the barrier layer is advantageously broken up in a high-temperature step, thus increasing the conductivity of the barrier layer. This advantageously reduces the disturbing influence of any remnant barrier layer.

According to a further preferred embodiment of the method according to the invention, a process layer that is composed at least in places of a secondary material is provided on the barrier layer. The barrier layer then prevents atoms of the primary material from diffusing as extraneous atoms into the secondary material and/or visa versa.

If a dielectric material or a semiconductor material is provided as the primary material and a material containing metal is provided as the secondary material, or the material containing metal is provided as the primary material and the dielectric material or the semiconductor material is provided as the secondary material, then the barrier layer primarily suppresses diffusion of metal atoms and metal ions from the material containing metal into the dielectric material or the semiconductor material.

If semiconductor materials with different doping are in each case provided as the primary material and as the secondary material, then the barrier layer prevents dopant atoms from diffusing from the primary material into the secondary material, and/or via versa.

Monocrystalline silicon is advantageously provided as the primary material and polycrystalline silicon is provided as the secondary material. If a semiconductor material with a monocrystalline structure is provided as the primary material and a semiconductor material with a polycrystalline structure is provided for the second material, then a barrier layer which is provided as a boundary area layer according to the invention also blocks the growth of displacements and grain boundaries of the polycrystalline semiconductor material into the monocrystalline semiconductor material.

A barrier layer which is formed by the sequential gas phase deposition process and is composed of aluminum oxide with a maximum layer thickness of 2 nanometers results in the difference in the dopant concentrations on both sides of the barrier layer being maintained to a level of a factor of 5 after the tempering steps which are normally carried out in the course of processing semiconductor devices.

In one particularly preferred embodiment of the method according to the invention, a trench is incorporated in a semiconductor substrate as the base substrate from the substrate surface. A section of the trench underneath a collar upper edge is clad with a collar insulator. A first subsection of a filling structure composed of the secondary material is provided underneath the collar upper edge. The boundary area layer is provided, with the trench being clad at least in places with the boundary area layer above the collar upper edge. A second subarea of the filling structure is disposed above the collar upper edge. The conductive structure is formed in a section of the semiconductor substrate adjacent to the trench above the collar upper edge, as a first section of the semiconductor substrate composed of the primary material.

In this case, the formation of the boundary area layer selectively on the vertical sections of the first structure is made possible, or is greatly simplified, by the extended choice of materials for the method according to the invention.

If a material whose etching resistance can be influenced by ion implantation is provided as the material for the boundary area layer, then the formation of the boundary area layer initially contains conformal deposition of a secondary layer composed of the material of the boundary area layer selectively on vertical sections of the first structure and on section of the trench wall above the collar edge of the trench. The etching resistance of sections of the secondary layer that are horizontal with respect to the substrate surface is then selectively reduced, with respect to vertical sections of the secondary layer, by ion implantation at right angles to the substrate surface. The horizontal sections of the secondary layer are then selectively etched back with respect to the vertical sections. The remaining vertical sections of the secondary layer form the boundary area layer.

One material that is suitable for a method such as this is aluminum oxide, $Al_2O_3$.

A further etching method by which the material of the boundary area layer is removed selectively on horizontal sections with respect to that on vertical sections is ion beam etching (reactive ion etch (RIE)).

According to one preferred embodiment of the method according to the invention, the boundary area layer on vertical sections of the first structure is formed by incomplete conformal deposition of the material of the boundary area layer. This makes use of the fact that, during sequential gas phase deposition, the deposition takes place in the direction from the substrate surface into the depth of a structure that is formed in the semiconductor substrate. For at least partial cladding of the trench, the boundary area layer is formed by sequential gas phase deposition from two or more molecular individual layers, with the deposition of each individual layer being controlled in the direction from a trench upper edge into the depth of the trench, and the boundary area layer being deposited in a vertically structured manner by terminating the deposition process for each individual layer before complete coverage.

If the deposition of the individual layers is in each case terminated early in a suitable manner, then the boundary area layer is formed only on the substrate surface and in upper areas of vertical sections of the first structure, and above the collar upper edge. Aluminum oxide $Al_2O_3$ is also a suitable material for a method such as this.

The method according to the invention is also suitable for forming an etching stop layer, with the etching stop layer being provided in the same way as the boundary area layer. The etching stop layer is provided from a material that can be etched with high selectivity with respect to materials that form structures between the substrate surface and the etching stop layer.

The method according to the invention is also suitable for forming an etching or polishing stop signal layer. After removal of structures which are formed between the substrate surface and the etching or polishing stop signal layer, the exposed sections of the etching stop signal layer result in a signal being generated or changed, and this can be evaluated by an etching or polishing apparatus.

Finally, the method according to the invention is suitable for forming a boundary area layer as an adhesion layer, to which the second material adheres better than to the material of the first structure.

In some cases, after being deposited, the barrier layer is compressed by a heat-treatment or tempering step.

The barrier layer is also used in a particularly advantageous manner as an etching stop or etching stop signal layer in the course of the removal of the process layer at least in places. Metal oxides have high etching selectivity with respect to materials that contain silicon. If the layer stack to be removed does not contain the metal, then, when the barrier layer is observed spectroscopically, it provides a unique and easily identifiable etching stop signal after removal of the components of the process layer located on it.

The method according to the invention leads to a barrier layer composed of silicon nitride or a metal oxide, or else of an oxide of rare earths, which is produced from sequential gas phase deposition or molecular beam epitaxy and is in the form of a layer system composed of two or more monomolecular individual layers with a layer thickness for which the electrical resistance of the barrier layer is governed by charge carrier transport based on the quantum-mechanical tunnel effect.

The layer thickness is preferably less than 20 nanometers, so that, for example with aluminum oxide layers, this results in considerable charge carrier transport transversely with respect to the layer. It is particularly preferable for the layer thickness to be at most 5 nanometers, with oxide formation in a base substrate that is located underneath the barrier layer and with silicon and tungsten sections being reliably prevented during a one-hour long annealing step at 650 degrees Celsius in an environment containing oxygen. The barrier layer thickness for hydrogen barrier layers is preferably more than 5 nanometers, and less than 20 nanometers.

Other features which are considered as characteristic for the invention are set forth in the appended claims.

Although the invention is illustrated and described herein as embodied in a barrier layer and a method for suppressing diffusion processes during the production of semiconductor devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
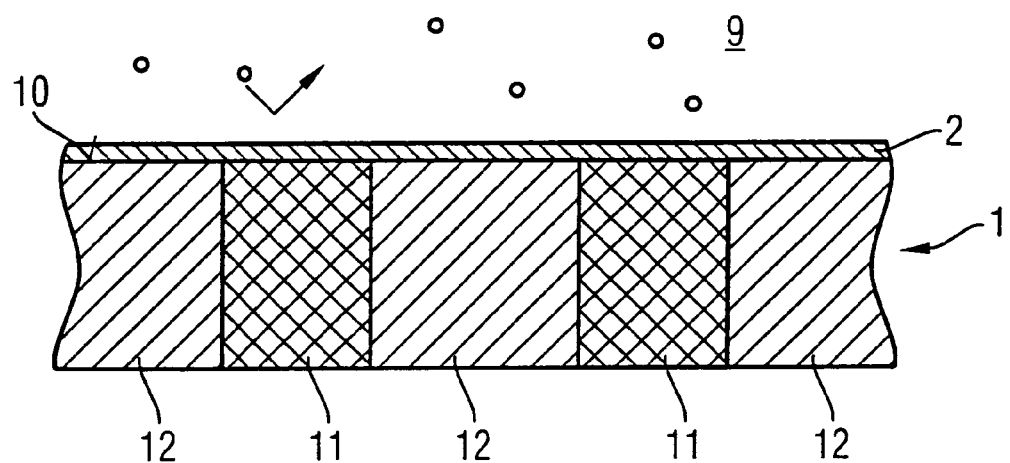
FIG. 1 is a diagrammatic, sectional view of a first exemplary embodiment of a barrier layer according to the invention as an oxygen barrier.

Referring now to the figures of the drawing in detail and first, particularly, to FIG. 1 thereof, there is shown a barrier layer 2 composed of aluminum oxide which is deposited by sequential gas phase deposition and is located on one substrate surface 10 of a base substrate 1, in which first sections 11 and second sections 12 are formed from different materials. The first sections 11 are composed of tungsten, while the second sections 12 are composed of silicon, for example. The base substrate 1 is subjected to a heat treatment in an oxygen environment 9 in a tempering step. Even the barrier layer 2 with a layer thickness of 5 nanometers prevents oxides from forming in the base substrate 1.

Figure 2:
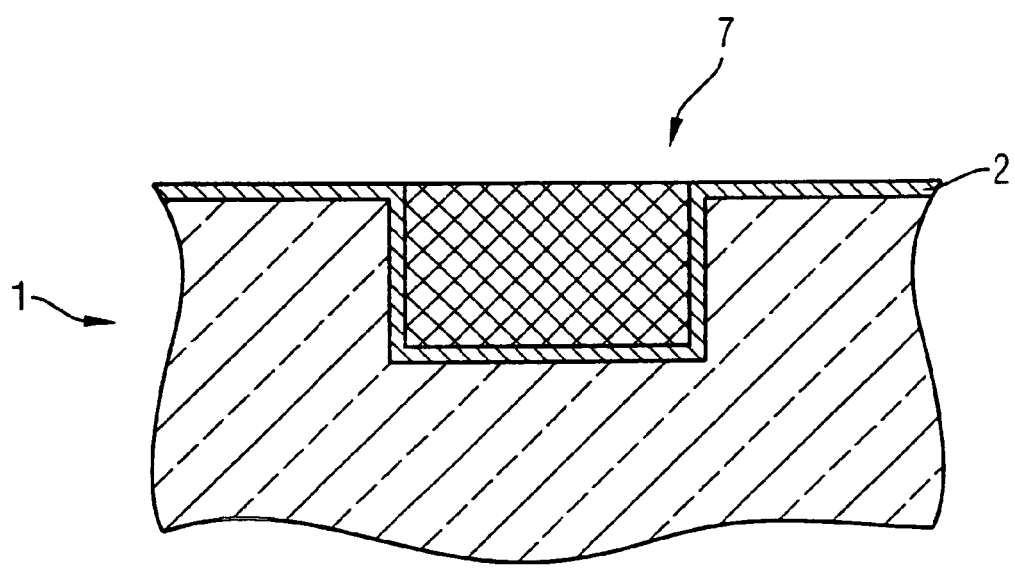
FIG. 2 is a sectional view of the first exemplary embodiment of the barrier layer according to the invention as a metal diffusion barrier for interconnect structures.

FIG. 2 shows an interconnect structure 7 which runs in the insulating base substrate 1, for example composed of silicon dioxide, and which is composed of a metal. The barrier layer 2 which is produced according to the invention is disposed between the insulating base substrate 1 and the interconnect 7, having being deposited by sequential gas phase deposition on the substrate surface 10 which is structured in the form of a relief having a trench which is intended to accommodate the interconnect structure 7. The barrier layer 2 prevents metal atoms from diffusing out of the interconnect structure 7 in a disadvantageous manner into the insulating base substrate 1. In addition, the barrier layer 2 is suitable for use as an etching stop layer or etching stop signal layer during the course of etching back the metal that is deposited outside the trench.

Figure 3:
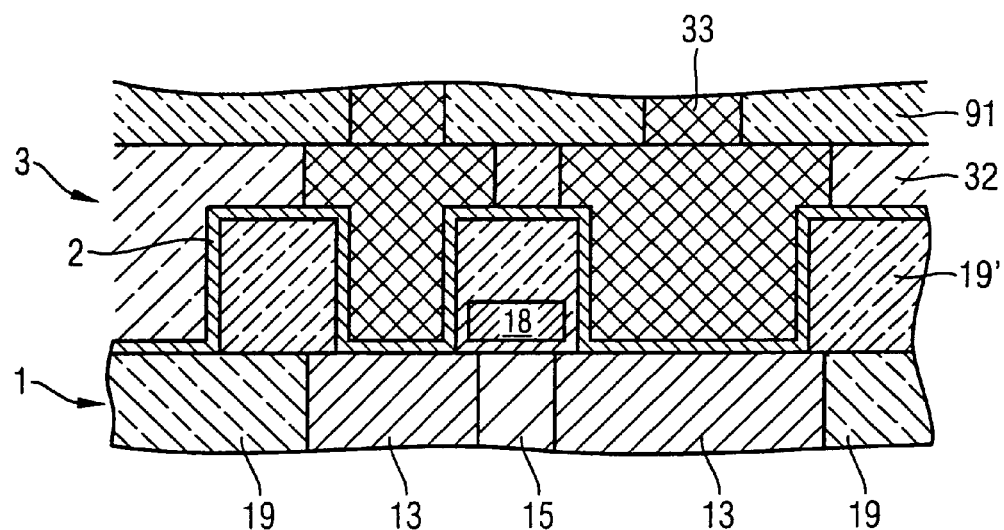
FIG. 3 is a sectional view of a second exemplary embodiment of the barrier layer according to the invention as a metal diffusion barrier for intermediate dielectric contact structures.

Insulator sections 19 and transistor structures with source/drain sections 13 and channel sections 15 as areas of different doping in a monocrystalline semiconductor substrate, as well as gate electrode sections 18 that are formed in further insulator sections 19', are formed in a base substrate 1 as shown in FIG. 3. A process layer 3 has contact structures 33 that pass through an insulator structure 32, in order to connect the source/drain regions 13 to interconnects which are not shown but are disposed in the vertical direction above an intermediate layer dielectric 91. In order to enlarge the surface area of the contact structures 33, the contact structures 33 are widen over the second insulator sections 19' and extend over their edges. The conformal barrier layer 2 which is deposited by sequential gas phase deposition covers the base substrate 1 reliably, even if the layer is thin, in the area of the edges of the insulator structures 19', and prevents metal atoms from diffusing out of the contact structures 33 into the base substrate 1.

Figure 4:
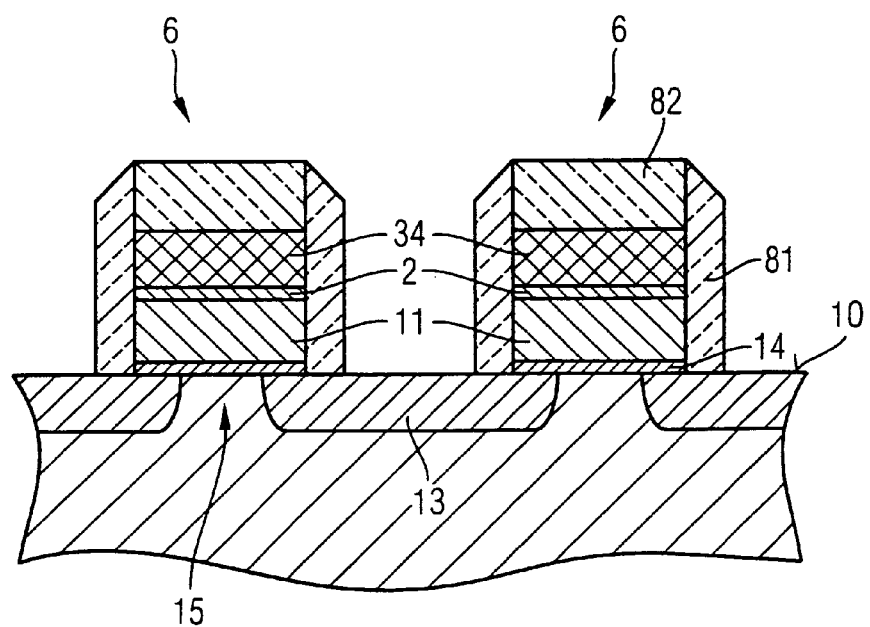
FIG. 4 is a sectional view of a third exemplary embodiment of the barrier layer according to the invention as a metal diffusion barrier for gate electrode structures.

In the exemplary embodiment illustrated in FIG. 4, extraneous atoms are prevented from diffusing out of a highly conductive section 34 of a gate electrode 6 into a semiconductor section 11 (which is adjacent to a gate dielectric 14) of the gate electrode structure 6 by the barrier layer 2. The gate electrode structure 6 also has a cap nitride 82, which covers the highly conductive section 34, as well as spacer structures 81, which are composed of a dielectric material, on side walls. The base substrate 1 also has the source/drain sections 13 and channel sections 15, which are formed as doped regions in monocrystalline silicon.

Figure 5:
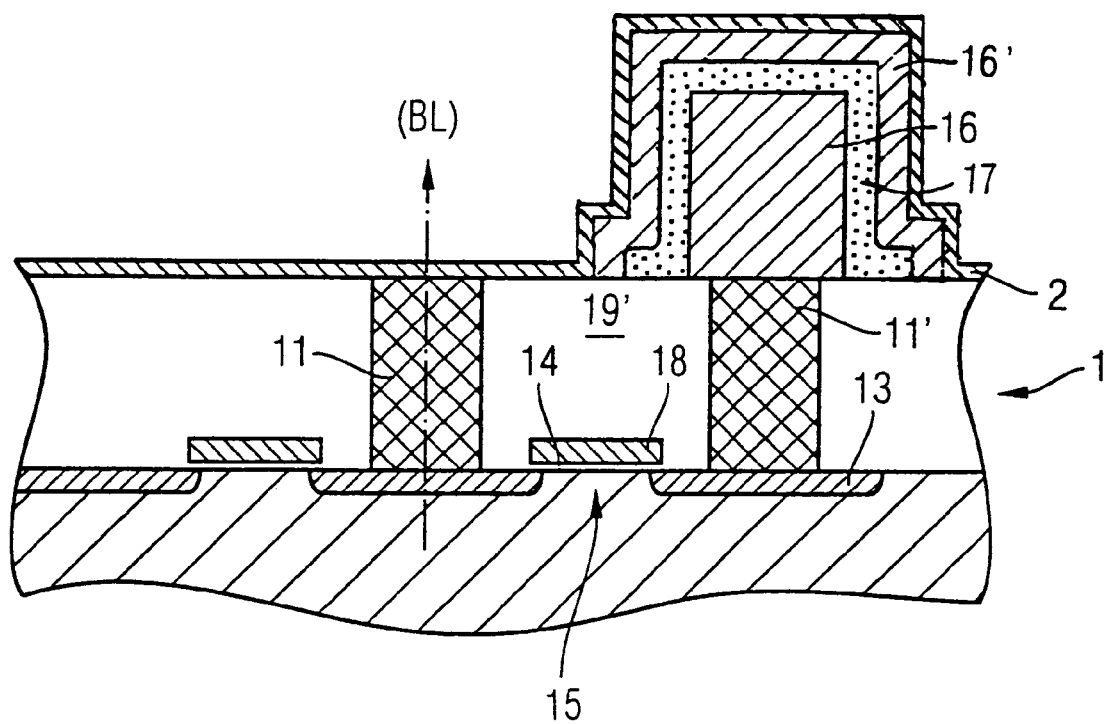
FIG. 5 is a sectional view of an exemplary embodiment of the barrier layer according to the invention as a hydrogen barrier.

FIG. 5 shows a ferroelectric memory cell having a selection transistor and a ferroelectric memory device that is provided in series with the selection transistor. The selection transistor is composed of the source/drain sections 13, which are formed as doped regions in monocrystalline silicon, and a channel section 15 as well as a gate dielectric section 14, which is adjacent to the channel section 15 in the vertical direction, and the gate electrode section 18 that is disposed above the gate dielectric section 14. An insulator section 19', in which contact sections 11, 11' are incorporated in order to make contact with the source/drain sections 13, is provided above the selection transistor. A first contact section 11 is intended to make further contact with a bit line BL, and is initially disconnected. A lower electrode section 16 is disposed on the second contact section 11', with a ferroelectric memory section 17 of the ferroelectric memory device being disposed above it. At least one iridium layer is provided as an oxygen barrier layer, with an iridium oxide layer being provided as a diffusion barrier, between the lower electrode section 16 and the second contact structure 11'. The ferroelectric memory material, a perovskite such as strontium-bismuth tantalate SBT or lead-zirconium titanate, PZT, is subjected, after being deposited, to an annealing step in an oxygen environment for recrystallization of the perovskite. An upper electrode section 16' is applied to the ferroelectric memory material. An aluminum oxide layer with a thickness of more than 5 nanometers and less than 20 nanometers is provided as the barrier layer 2 on the substrate surface, which is structured in the form of relief by the electrode structure of the memory cell and prevents reduction of the ferroelectric memory material due to hydrogen diffusing in during the hydrogen tempering process at a later time during the processing.

Figure 6A:
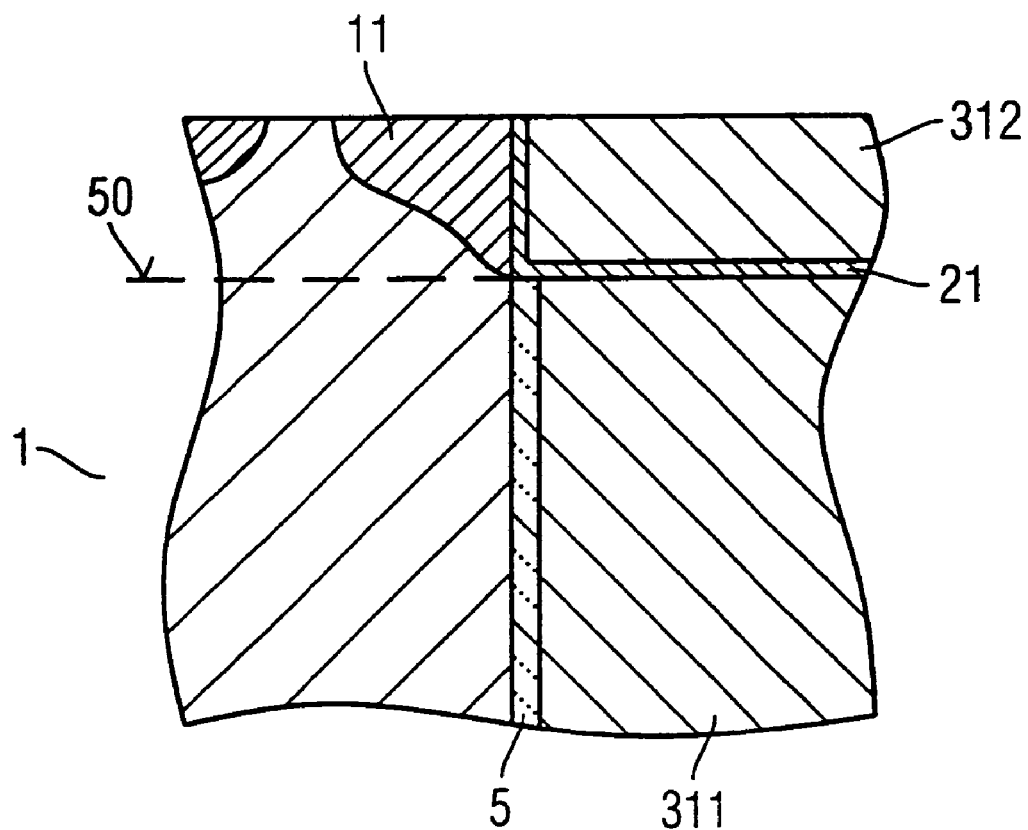
FIG. 6A is a sectional view of the barrier layer according to the prior art.
Figure 6B:
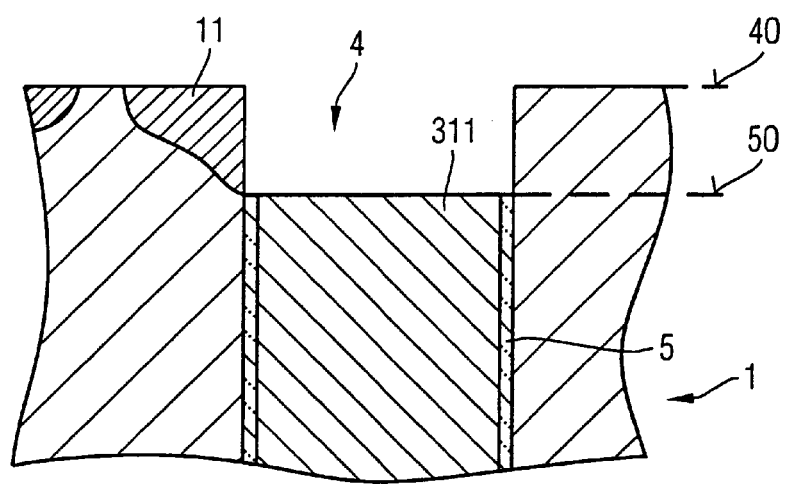
FIGS. 6B–6D are sectional views of an exemplary embodiment of the barrier layer according to the invention as a boundary area layer between the two semiconductor structures.

A trench 4 is incorporated in the substrate material 1, as illustrated in FIG. 6B. The trench 4 is clad with a collar insulator 5 underneath a collar upper edge 50. A first structure 11 with a monocrystalline crystalline structure is also formed in the semiconductor substrate 1 and is adjacent to the trench 4 above the collar upper edge 50. The trench 4 is also filled with a polycrystalline material, which forms a first subarea 311 of a second structure or filling structure 31, which is to be produced in a subsequent process.

The object in the following text is to electrically conductively connect to one another the electrically conductive first structure 11, which corresponds for example to the drain region of a selection transistor of a 1T1C memory cell, and the first subarea 311 of a first electrode, which is formed in the interior of the trench 4, of a memory capacitor of the 1T1C memory cell, in a very simple manner and with a minimum number of additional process steps.

If the trench 4 were to be filled completely in a single operation with doped polycrystalline semiconductor material, this would result in a direct junction above the collar edge 50 between the polycrystalline semiconductor material of the second structure 31 and the monocrystalline semiconductor material of the first structure 11. During further processing of the semiconductor substrate 1 and during operation of the 1T1C memory cell, migration or grain boundaries of the crystalline structure of the polycrystalline semiconductor material would increasingly continue in the monocrystalline material, disadvantageously changing its characteristics. If the first and second structures were to have different doping, doping atoms would diffuse into the respective other structure during subsequent process steps.

Thus, as is illustrated in FIG. 6B, a boundary area layer 21 is conventionally deposited by an LPCVD method. After this, sections of the conformal boundary area layer 21 which are disposed on a surface of the semiconductor substrate 1 are removed by a chemical mechanical polishing (CMP) method.

Sections of the boundary area layer 21 which are disposed on the first subarea 311 cannot be removed easily, so that the boundary area layer 21 is left in these sections. After the deposition of a second subarea 312 of the second structure, that section of the boundary area layer 21 that is formed between the two subareas 311, 312 reduces the electrical and the chemical quality of the second structure 31, which is formed from the two subareas 311, 312.

Thus, according to the invention, a conformal initial layer 20 is provided by sequential gas phase deposition. A conformal secondary layer can then be formed from a material whose etching resistance in sections which are horizontal with respect to one surface of the semiconductor substrate 1 can be reduced in comparison to vertical sections by ion implantation.

Figure 6C:
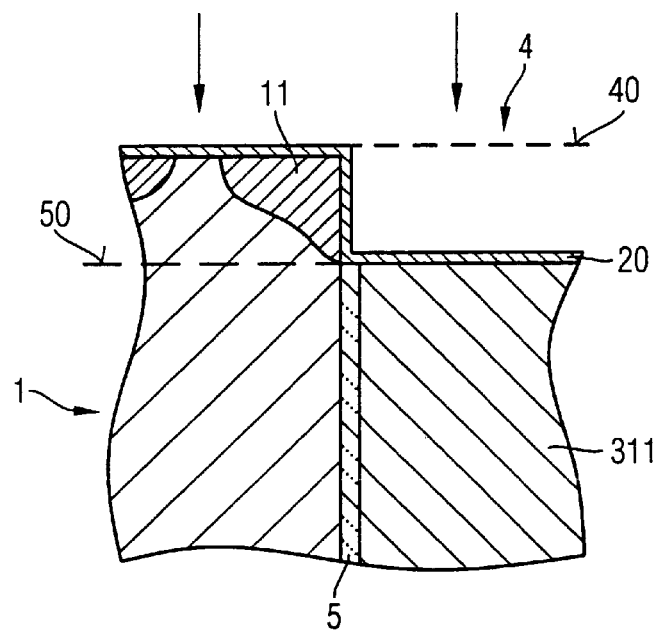

The direction of the ion implantation is indicated schematically by arrows in FIG. 6C. In consequence, all the horizontal sections of the secondary layer or initial layer 20 can be etched selectively with respect to the vertical sections.

When different materials are used, which are preferably removed by ion beam etching (RIE) in horizontal sections of the boundary area layer, the arrows indicate the direction of the directional etching process.

Figure 6D:
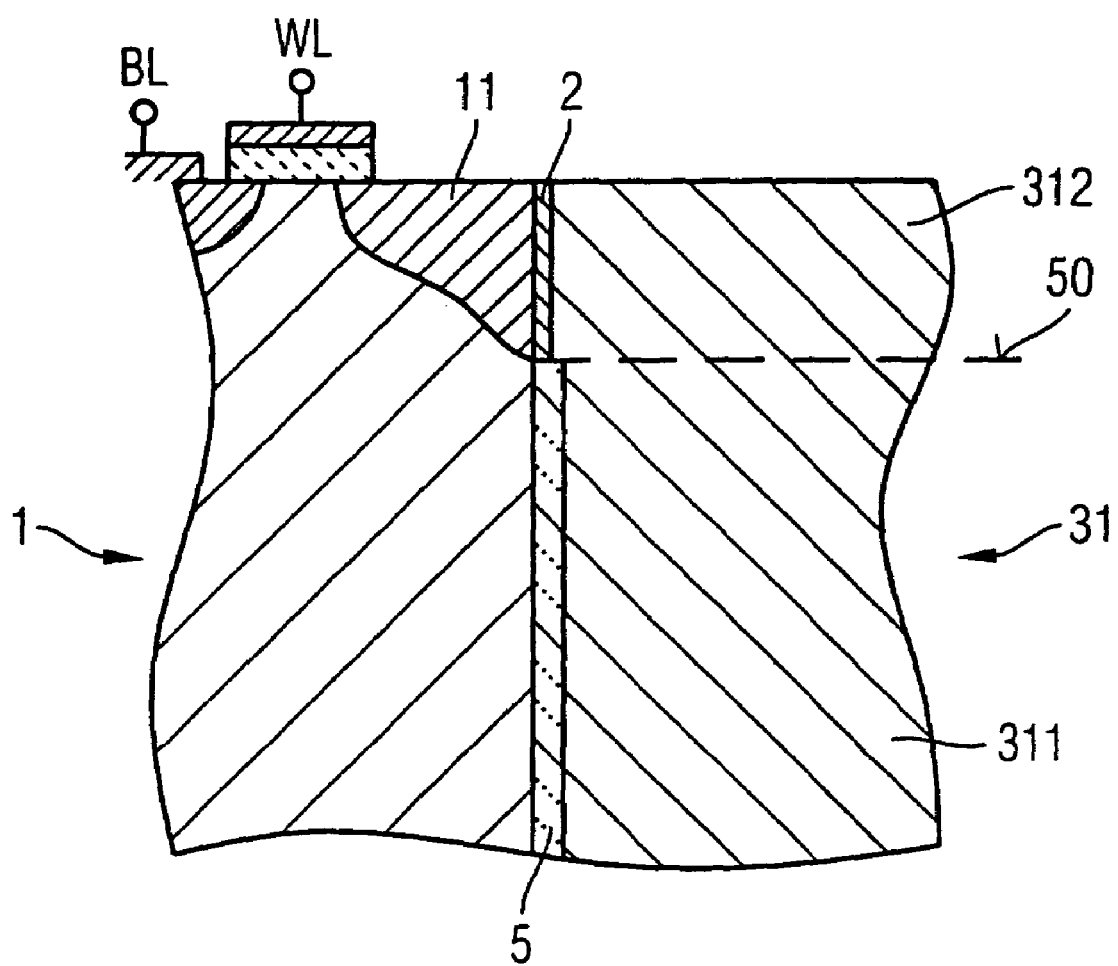

As is illustrated in FIG. 6D, only the vertical sections of the initial layer 20, which form the boundary area layer 2, remain after a subsequent etching step. The second structure 31 is homogenous and has better electrical and mechanical characteristics than a second structure 31, as illustrated in FIG. 6A, which is composed of two subareas 311, 312 on both sides of a boundary area layer 21 disposed between them. The transistor structures are completed on the surface of the semiconductor substrate 1, and conductive bit line structures and word line structures BL, WL are formed for addressing and data transmission.

We claim:

1. A method for avoiding impurities in layers and structures in a semiconductor wafer caused by extraneous substances in a course of manufacturing semiconductor devices, which comprises the steps of:

providing a base substrate formed at least in places from a primary material;

using one of a sequential gas phase deposition process and a molecular beam epitaxy process for forming a dielectric layer on at least sections of one substrate surface of the base substrate formed of the primary material, the dielectric layer formed of a material selected from the group consisting of silicon nitride, a metal oxide, and an oxide of rare earths, the dielectric layer functioning as a barrier layer composed of a barrier material being substantially impermeable to the extraneous substances; and subjecting the base substrate provided with the barrier layer to one of the following further processing steps:

an annealing step in an environment containing oxygen, and the barrier layer preventing oxidation of the primary material, an annealing step in an environment containing hydrogen, and the barrier layer preventing a reduction of the primary material, a heat-treatment step in an environment containing ammonia, and the barrier layer preventing the formation of nitrides of the primary material, and a heat-treatment step in an environment containing arsenic, and the barrier layer preventing the primary material from being doped with the arsenic.

2. The method according to claim 1, which further comprises forming the barrier layer from a material selected from the group consisting of $HfO_2$, $ZrO_2$, $Ta_2O_5$, $Nb_2O_5$, $Al_2O_3$, $Pr_2O_5$ and $La_2O_3$.

3. The method according to claim 1, which further comprises depositing the barrier layer with a layer thickness of less than 20 nanometers.

4. The method according to claim 1, which further comprises forming a relief in the substrate surface of the base substrate.

5. The method according to claim 1, which further comprises breaking up the barrier layer using a high-temperature step after the annealing step, thus increasing a conductivity of the barrier layer.

6. The method according to claim 1, which further comprises providing a process layer, composed at least in places of a secondary material, on the barrier layer.

7. The method according to claim 6, which further comprises using a dielectric material as the primary material and a material containing metal as the secondary material, and the barrier layer prevents diffusion of metal atoms and metal ions from the secondary material into the dielectric material.

8. The method according to claim 6, which further comprise using a semiconductor material as the primary material and a material containing metal as the secondary material, and the barrier layer prevents diffusion of metal atoms and metal ions from the material containing metal into the semiconductor material.

9. The method according to claim 6, which further comprises using semiconductor materials with different doping levels in each case for the primary material and the secondary material, and the barrier layer prevents diffusion of dopant atoms between the primary material and the secondary material.

10. The method according to claim 9, which further comprises using monocrystalline silicon as the primary material and polycrystalline silicon as the secondary material.

11. The method according to claim 10, which further comprises:
    forming a trench in the base substrate starting from the substrate surface;
    providing a collar insulator underneath a collar upper edge in the trench;
    forming a first structure as a first section of the base substrate, the first structure formed of the primary material at least in a section of the base substrate which is adjacent to the trench above the collar upper edge;
    forming a first subsection of a filling structure formed of the secondary material in the trench underneath the collar upper edge;
    cladding the trench at least in places with the barrier layer above the collar upper edge; and
    disposing a second subsection of the filling structure above the collar upper edge.

12. The method according to claim 11, which further comprises:
    forming the barrier layer, by the sequential gas phase deposition process, from at least two molecular individual layers for at least partial cladding of the trench, with a deposition of each individual layer being controlled in a direction from a trench upper edge into a depth of the trench; and
    structuring the barrier layer vertically by terminating a deposition of each individual layer before complete coverage.

13. The method according to claim 6, which further comprises using the barrier layer as one of an etching stop layer and as an etching stop signal layer in a course of removing the process layer at least in places.

14. The method according to claim 6, which further comprises using a material containing metal as the primary material and a dielectric material as the secondary material, and the barrier layer prevents diffusion of metal atoms and metal ions from the material containing metal into the dielectric material.

15. The method according to claim 6, which further comprise using a material containing metal as the primary material and a semiconductor material as the secondary material, and the barrier layer prevents diffusion of metal atoms and metal ions from the material containing metal into the semiconductor material.

* * * * *